(12) United States Patent
Hopper et al.

(10) Patent No.: US 7,525,323 B1
(45) Date of Patent: Apr. 28, 2009

(54) METHOD FOR MEASURING PERMEABILITY OF A FERROMAGNETIC MATERIAL IN AN INTEGRATED CIRCUIT

(75) Inventors: Peter J. Hopper, San Jose, CA (US); Kyuwoon Hwang, Palo Alto, CA (US); Peter I. Smeys, Mountain View, CA (US); Andrei Papou, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 272 days.

(21) Appl. No.: 11/623,531

(22) Filed: Jan. 16, 2007

(51) Int. Cl.
*G01R 27/08* (2006.01)
*G01R 33/12* (2006.01)
*G01R 31/26* (2006.01)

(52) U.S. Cl. .................. 324/691; 324/713; 324/719

(58) Field of Classification Search ............ 324/633, 324/227, 691, 719
See application file for complete search history.

(56) References Cited

U.S. PATENT DOCUMENTS

| | | | | |
|---|---|---|---|---|
| 4,649,495 A | * | 3/1987 | Cagan et al. ............. | 324/239 |
| 5,528,142 A | * | 6/1996 | Feickert ................. | 324/236 |
| 5,537,042 A | * | 7/1996 | Beutler et al. ........... | 324/432 |
| 6,147,497 A | * | 11/2000 | Berryman et al. ......... | 324/357 |
| 7,088,115 B1 | * | 8/2006 | Glenn et al. ............ | 324/691 |
| 7,443,177 B1 | * | 10/2008 | Bowler ................. | 324/715 |
| 2001/0054894 A1 | * | 12/2001 | Goldfine et al. ........ | 324/207.17 |

* cited by examiner

*Primary Examiner*—Diego Gutierrez
*Assistant Examiner*—John Zhu
(74) *Attorney, Agent, or Firm*—Vedder Price P.C.

(57) ABSTRACT

A method for determining consistency of a permeability of a ferromagnetic material in integrated circuits in which a test strip of the subject ferromagnetic material is included for testing with an impedance measurement instrument, such as an inductance-capacitance-resistance (LCR) meter, with which the resistance of the strip of ferromagnetic material over a range of measurement signal frequencies is determined based upon the measured impedance values. The measured impedance values, measurement signal frequencies and selected permeability values are then used in numerical simulations to produce multiple resistance versus frequency curves each of which corresponds to one of the selected permeability values.

4 Claims, 1 Drawing Sheet

METHOD FOR MEASURING PERMEABILITY OF A FERROMAGNETIC MATERIAL IN AN INTEGRATED CIRCUIT

BACKGROUND

1. Field of the Invention

The present invention relates to testing techniques for elements within integrated circuits, and in particular, to testing techniques for measuring characteristics of ferromagnetic materials in integrated circuits.

2. Related Art

As the dimensions of circuit devices (e.g., transistors) continue to decrease, the size of the average die needed for a given integrated circuit (IC) has also decreased. Additionally, circuit densities have increased. Accordingly, for a given die size, the number of circuits and subsystems have increased, thereby allowing the level of integration to increase. In the case of radio frequency (RF) circuits and systems, this has meant that more and larger portions of the subsystems have been integrated into a single IC. Further, as the frequencies of operation increase, it becomes increasingly important to also integrate more of the necessary reactive components (e.g., capacitors and inductors) within the IC. While capacitors can be implemented using various semiconductor structures, including transistor structures, implementing inductors requires the use of ferromagnetic materials.

However, a number of difficulties are encountered when trying to perform the measurements necessary for characterizing ferromagnetic materials implemented in an IC environment, particularly in a production environment and for high signal frequencies. A common instrument used for characterizing ferromagnetic materials has been a vibrating sample magnetometer (VSM), which is used to measure B-H curves to determine permeability. However, using a VSM in a production environment is a non-trivial task, since the material to be characterized must be placed, e.g., suspended, within a uniform magnetic field and forced to undergo mechanical vibration, e.g., induced directly or indirectly (e.g., via control of a piezoelectric structure). Moreover, operation of a VSM is typically limited to very low frequencies, e.g., less than 100 Hertz.

Accordingly, it would be desirable to have a method for measuring permeability of a ferromagnetic material for use in an integrated circuit operating at high signal frequencies, particularly within a production environment.

SUMMARY OF THE INVENTION

In accordance with the presently claimed invention, a method is provided for determining consistency of a permeability of a ferromagnetic material used in integrated circuits in which a test strip of the subject ferromagnetic material is included for testing with an impedance measurement instrument, such as an inductance-capacitance-resistance (LCR) meter, with which the resistance of the strip of ferromagnetic material over a range of measurement signal frequencies is determined based upon the measured impedance values. The measured impedance values, measurement signal frequencies and selected permeability values are then used in numerical simulations to produce multiple resistance versus frequency curves each of which corresponds to one of the selected permeability values.

In accordance with one embodiment of the presently claimed invention, a method for determining consistency of a permeability of a ferromagnetic material used in a plurality of integrated circuits (ICs) includes:

selecting an IC fabricated in accordance with a fabrication process having associated therewith a critical dimension for conductive line widths, and including
- circuitry with a plurality of active semiconductor devices, one or more conductors, one or more semiconductor regions, and at least one passive circuit element at least a portion of which comprises a ferromagnetic material, and
- a strip of the ferromagnetic material which has a length with first and second measurement contacts at first and second opposed ends of the length, respectively, and a width substantially wider than the critical dimension;

electrically coupling an impedance measurement instrument to the first and second measurement contacts;

measuring an impedance of the strip of the ferromagnetic material with the impedance measurement instrument at each of a plurality of measurement signal frequencies to produce a plurality of measured impedance values; and using at least a portion of said plurality of measured impedance values, at least a portion of said plurality of measurement signal frequencies and a plurality of selected permeability values in a plurality of numerical simulations to produce a plurality of resistance versus frequency curves each of which corresponds to one of said plurality of selected permeability values.

DETAILED DESCRIPTION

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators. Further, while the present invention has been discussed in the context of implementations using discrete electronic circuitry (preferably in the form of one or more integrated circuit chips), the functions of any part of such circuitry may alternatively be implemented using one or more appropriately programmed processors, depending upon the signal frequencies or data rates to be processed.

Figure 1:
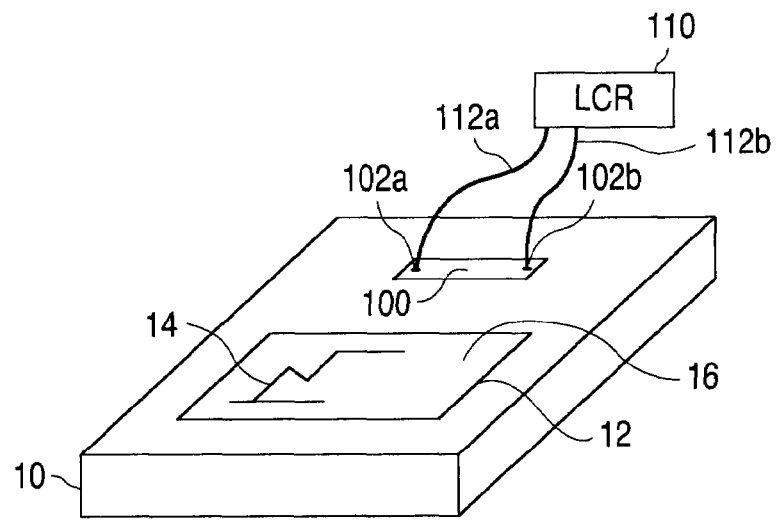
FIG. 1 depicts an integrated circuit containing ferromagnetic material in a manner suitable for testing in accordance with the presently claimed invention.

Referring to FIG. 1, as is well known, an integrated circuit includes a substrate 10 on which active circuitry 12 is integrated, with lines of conductors 14 and semiconductor regions 16 among the active circuit components (e.g., transistors) and passive circuit components (e.g., resistors, capacitors and inductors). For purposes of the presently claimed invention, also included is a strip 100 of ferromagnetic material such as that used for implementing inductive circuit elements within the circuitry 12. This strip 100 of ferromagnetic material is fabricated as a relatively long line with accessible contacts 102a, 102b at both ends, and has a line width that is wide as compared to the critical dimension capability (e.g., by a factor of 10 or more) of the process used to fabricate the IC. Additionally, the thickness of the strip 100 (i.e., the dimension that is normal to the surface of the substrate 10) is selected to be approximately equal to the skin depth associated with the strip 100 at a signal frequency within the rated testing capability of a conventional impedance measurement instrument (e.g., an inductance-capacitance-resistance, or LCR, meter).

As is well known, the resistance displayed by a conductor to RF signals is greater than the resistance displayed to a DC voltage due to skin effect which causes signal current to be concentrated in a portion of the conductor, e.g., the periphery, due to the effects of magnetic flux formed within the interior of the conductor. It is further well known that the result of the skin effect, i.e., the skin depth of the conductor, is related to the frequency of the measurement signal and permeability of the conductor as follows:

$$\delta = 1/(\sqrt{(\pi\mu f\sigma)})$$

where:
$\delta$=skin depth
$\sqrt{(\,)}$=square root function
$\pi$=pi
$\mu$=permeability
f=frequency
$\sigma$=conductivity Referring again to FIG. 1, an impedance measurement instrument 110, e.g., an LCR, is connected via its test leads 112a, 112b to the contacts 102a, 102b of the test strip 100 so that a resistance measurement can be performed. Such an instrument 110 is conventional in nature and, as is well known in the art, is used to measure the impedance characteristics of the strip 100 over a range of measurement signal frequencies. Of particular interest for purposes of the presently claimed invention is the real portion of the impedance (i.e., the resistance which is the inverse of conductivity) of the test strip 100 over the selected range of measurement signal frequencies.

To enhance the results of this testing, in accordance with a preferred embodiment, the test strip 100 should be isolated in terms of capacitive and inductive couplings to the other conductors 14 and semiconductor region 16. Further enhancement can be achieved by fabricating the test strip 100 on a thicker portion of the substrate 10 in which the substrate serves as a dielectric medium, or alternatively on a separate dielectric medium (e.g., a glass substrate).

As noted above, the effect on the real impedance due to skin effect, in terms of skin depth, is related to the square root of the permeability of the material. Accordingly, by comparing the change in the real portion of impedance over frequency to that predicted by simulations, such as three dimensional numerical solutions of Maxwell's equations (e.g., using any of the conventional and well known finite element numerical solvers of Maxwell's equations), the permeability can be estimated with high accuracy. (One of many examples of such a computation tool is the Maxwell 3D program, by Ansoft Corporation, which provides three-dimensional electromagnetic field simulations for electromechanical designs.) Repeating these simulations for multiple selected values of permeability produces a set of plots, or curves, of resistance versus frequency with each plot corresponding to one of the selected values of permeability. This set of plots can then be used as reference data against which similar results of impedance measurements performed on other similar ICs can be compared, with the results of such comparisons indicating the degree of consistency of the permeability of the ferromagnetic material used in the tested ICs.

Figure 2:
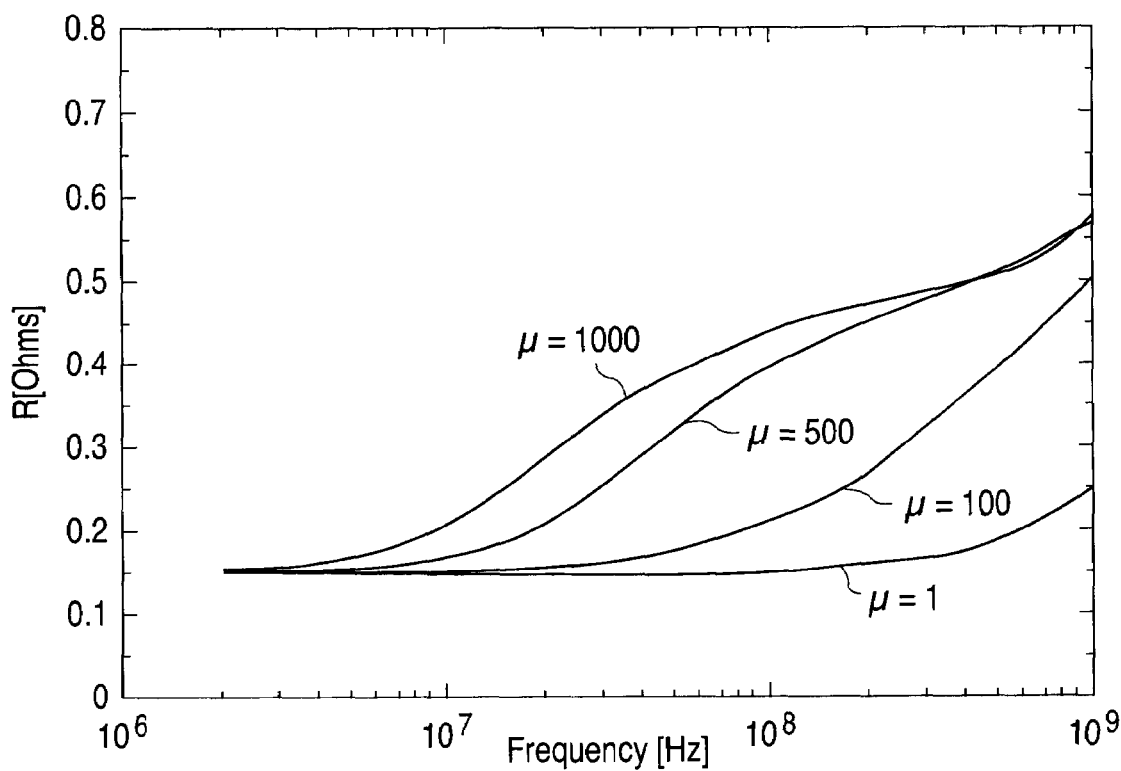
FIG. 2 is a set of simulation curves representing resistance versus frequency for a strip of ferromagnetic material in an integrated circuit having four values of permeability.

Referring to FIG. 2, examples of results of such simulations for comparison purposes are shown for selected permeability values of 1, 100, 500 and 1000 for a ferromagnetic material having a length of 500 microns, a width of 100 microns, a thickness of 5 microns, and a conductivity of 15 micromhos per centimeter. As shown, the resistance varies between approximately 0.15 ohm and 0.57 ohm, depending upon permeability, over a frequency range of 20 megahertz to 1 gigahertz, with a curvature, or roll-up, due to skin effect.

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. A method for determining consistency of a permeability of a ferromagnetic material used in a plurality of integrated circuits (ICs), comprising:
   selecting at least one of a plurality of ICs fabricated in accordance with a fabrication process having associated therewith a critical dimension for conductive line widths, and including
      circuitry with a plurality of active semiconductor devices, one or more conductors, one or more semiconductor regions, and at least one passive circuit element at least a portion of which comprises a ferromagnetic material having a permeability, and
      a strip of said ferromagnetic material which has a length with first and second measurement contacts at first and second opposed ends of said length, respectively, and a width substantially wider than said critical dimension;
   electrically coupling an impedance measurement instrument to said first and second measurement contacts;
   measuring an impedance of said strip of said ferromagnetic material with said impedance measurement instrument at each of a plurality of measurement signal frequencies to produce a plurality of measured impedance values; and
   using at least a portion of said plurality of measured impedance values, at least a portion of said plurality of measurement signal frequencies and a plurality of selected permeability values in a plurality of numerical simulations to produce a plurality of resistance versus frequency curves each of which corresponds to one of said plurality of selected permeability values.

2. The method of claim 1, wherein said strip of said ferromagnetic material is substantially isolated with respect to at least one of capacitive and inductive couplings with at least one of said one or more conductors and said one or more semiconductor regions.

3. The method of claim 1, wherein said impedance measurement instrument comprises an inductance-capacitance-resistance (LCR) meter.

4. The method of claim 1, wherein said using at least a portion of said plurality of measured impedance values, at least a portion of said plurality of measurement signal frequencies and a plurality of selected permeability values in a plurality of numerical simulations to produce a plurality of resistance versus frequency curves comprises computing said plurality of resistance versus frequency curves substantially in accordance with a finite element numerical solver of Maxwell Equations.

* * * * *